(12) United States Patent
Murayama

(10) Patent No.: US 6,831,000 B2
(45) Date of Patent: Dec. 14, 2004

(54) SEMICONDUCTOR DEVICE MANUFACTURING METHOD

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/750,905

(22) Filed: Jan. 5, 2004

(65) Prior Publication Data

US 2004/0137661 A1 Jul. 15, 2004

(30) Foreign Application Priority Data

Jan. 15, 2003 (JP) ........................................ 2003-007461

(51) Int. Cl.[7] .............................................. H01L 21/44
(52) U.S. Cl. ...................... 438/613; 438/614; 438/928; 438/977; 438/667
(58) Field of Search ................................. 438/613, 614, 438/977, 928, 106, 666, 667

(56) References Cited

U.S. PATENT DOCUMENTS 4,978,639 A * 12/1990 Hua et al. .................. 438/465
5,686,067 A * 11/1997 Shih et al. ................. 424/70.15
6,620,731 B1 * 9/2003 Farnworth et al. .......... 438/667
2004/0017012 A1 * 1/2004 Yamada et al. ............. 257/774

FOREIGN PATENT DOCUMENTS

| JP | 59-222954 | 12/1984 |
| JP | 61-88546 | 5/1986 |
| JP | 63-156348 | 6/1988 |
| JP | 2000-286304 | 10/2000 |

* cited by examiner

Primary Examiner—Thanh Nguyen
(74) Attorney, Agent, or Firm—Armstrong, Kratz, Quintos, Hanson & Brooks, LLP

(57) ABSTRACT

The present invention comprises the steps of forming a bump metal film as a pattern having an opening portion on an area of a seed metal film that corresponds to a connecting pad of a semiconductor substrate, forming a through hole by etching the seed metal film, the connecting pad, and the semiconductor substrate located under the opening portion of the bump metal film while using the bump metal film as a mask, grinding a back surface of the semiconductor substrate, forming an insulating film on a side surface of the through hole, forming a through wiring in the through hole by an electroplating, and forming a metal bump by etching the seed metal film.

11 Claims, 10 Drawing Sheets

(partial plane view of A portion)

SEMICONDUCTOR DEVICE MANUFACTURING METHOD

BACKGROUND OF THE INVENTION

1. Field of the Invention

The present invention relates to a semiconductor device manufacturing method and, more particularly, a method of manufacturing a semiconductor device having through wirings that make possible electrical conduction between connection terminals on an element forming surface side and connection terminals on a back surface side.

2. Description of the Related Art

In reply to a request for a higher density of the packaging technology, the packaging structure in which a plurality of semiconductor chips are laminated and packaged three-dimensionally on the wiring substrate is developed nowadays. As the method of implementing such packaging structure, there is the method of connecting the connection terminals on the element forming surface side of the semiconductor chip and the connection terminals on the back surface side via the through holes that pass through the semiconductor chip and then laminating plural times this semiconductor chip on the wiring substrate to be connected mutually.

In the method of forming the through wirings in the semiconductor chip in the related art, as shown in FIG. 1A, first a semiconductor wafer 100 on which predetermined transistors, multi-layered wirings (not shown), etc. are formed and which has a thickness of about 400 μm is prepared. Connecting pads 102 are exposed from an upper surface of the semiconductor wafer 100, and portions except the connecting pads 102 are covered with a passivation film 104.

Then, as shown in FIG. 1B, a resist film (not shown) having opening portions at center portions of the connecting pads 102 is patterned on the connecting pads 102 and the passivation film 104 (masking step 1).

Then, the connecting pads 102 and the underlying semiconductor wafer 100 are etched sequentially by RIE (Reactive Ion Etching), or the like while using the resist film as a mask. Thus, through holes 100a each passing through the semiconductor wafer 100 from the element forming surface to the back surface are formed.

Then, as shown in FIG. 1C, an insulating film 106 such as a silicon oxide film, or the like is formed on inner surfaces of the through holes 100a, the connecting pads 102, and the passivation film 104 by the CVD, or the like. This insulating film 106 is formed to isolate electrically a conductive film, which is filled in the through holes 100a later, from the semiconductor wafer 100.

Then, as similarly shown in FIG. 1C, a dry-film resist film 108 having opening portions 108a at portions, which correspond to major portions of the connecting pads 102 formed like a ring, is formed on the insulating film 106 (masking step 2). Then, the insulating film 106 is etched by using the dry-film resist film 108 as a mask, and then the dry-film resist film 108 is removed. Thus, as shown in FIG. 1D, the insulating film 106 is still left on the inner surfaces of the through holes 100a, but the ring-like connecting pads 102 are exposed.

Then, as shown in FIG. 1E, a seed Cu film 110 is formed on the resultant structure in. FIG. 1D by the electroless plating, the sputter method, or the like. Then, a resist film 112 having opening portions 112a on the through holes 100a and the connecting pads 102 is formed (masking step 3).

Then, a Cu film pattern 114 is formed in interiors of the through holes 100a and the opening portions 112a of the resist film 112 by the electroplating utilizing the seed Cu film 110 as a plating power-supply layer. Then, as shown in FIG. 1F, the resist film 112 is removed, and then the seed Cu film 110 is etched by using the Cu film pattern 114 as a mask. Thus, Cu bumps 114a each connected electrically to the connecting pad 102 and Cu plugs 114b each connected to this Cu bump 114a are formed.

Then, as shown in FIG. 1G, a thickness of the semiconductor wafer 100 is reduced by grinding the back surface of the semiconductor wafer 100 by virtue of the grinder. At this time, the semiconductor wafer 100 and the Cu plugs 114b filled in the through holes 100a are ground at the same time. Thus, top end portions of the Cu plugs 114b on the back surface side of the semiconductor wafer 100 act as connection terminals 114c on the back surface side. In this manner, the connecting pads 102 and the Cu bumps 114a connected thereto on the element forming surface side of the semiconductor wafer 100 are connected to the connection terminals 114c on the back surface side via the through holes 100a.

Then, individual semiconductor chips are obtained by dicing the semiconductor wafer 100.

Also, it is set forth in Patent Literature 1 (Patent Application Publication (KOKAI) Sho 59-222954), Patent Literature 2 (Patent Application Publication (KOKAI) Sho 63-156348), Patent Literature 3 (Patent Application Publication (KOKAI) Sho 61-88546), and Patent Literature 4 (Patent Application Publication (KOKAI) 2000-286304), for example, that in order to laminate and package a plurality of semiconductor chips three-dimensionally, the through wirings used to connect the connection terminals on the element forming surface side and the connection terminals on the back surface side are provided in the semiconductor chip.

However, in the above manufacturing methods in the related art, since three masking steps (masking steps 1 to 3) are needed, not only the process becomes complicated to lower the yield of production but also there is a possibility that an increase in a production cost is brought about. Also, since the through holes and the Cu bumps are formed via individual masking steps respectively, the care must be taken not to cause the displacement in respective masking steps. Therefore, in case formations of the bumps, the connecting pads, and the through holes having above structures should be further miniaturized, in some cases it becomes difficult to get their desired structures because of the displacement.

In addition, in the above related art, upon grinding the back surface of the semiconductor wafer 100, the Cu plugs 114b filled in the through holes 100a and the semiconductor wafer 100 must be ground simultaneously.

At this time, sometimes the Cu plugs 114b are electrically short-circuited mutually because the Cu plugs 114b to be ground are extended to the ground surface of the semiconductor wafer 100, otherwise the grinding operation cannot be carried out satisfactorily because ground Cu pieces are clogged in the grinding wheel (grindstone) of the grinder. In this way, since the special grinding equipment is required of the related art, a huge plant and equipment investment must be made and thus it is possible to bring about an increase in a production cost.

Here, in above Patent Literatures 1, 2, 3 and 4, the above problems caused in manufacturing the semiconductor chip, which is equipped with the connecting pads and the through wirings connected to the bumps, are not taken into consideration at all.

SUMMARY OF THE INVENTION

It is an object of the present invention to provide a semiconductor device manufacturing method capable of manufacturing a thin semiconductor device having a structure, in which connection terminals on an element forming surface side and connection terminals on a back surface side are connected mutually via through holes respectively, without generation of any trouble.

The present invention provides a semiconductor device manufacturing method which comprises the steps of preparing a semiconductor substrate having a connecting pad on an element forming surface; forming a seed metal film to cover the connecting pad on the semiconductor substrate; forming a bump metal film as a pattern having an opening portion in a predetermined portion on an area of the seed metal film that corresponds to the connecting pad; forming a through hole, which is communicated with the opening portion of the bump metal film and passes through to a back surface of the semiconductor substrate, by etching sequentially the seed metal film, the connecting pad, and the semiconductor substrate located under the opening portion of the bump metal film while using the bump metal film as a mask; reducing a thickness of the semiconductor substrate by grinding the back surface of the semiconductor substrate; forming selectively an insulating film to cover at least the semiconductor substrate on a side surface of the through hole; forming a conductive film in the opening portion of the bump metal film and the through hole by an electroplating, which utilizes the seed metal film and the bump metal film connected to the seed metal film as a plating power-supply layer, to provide a through wiring which is connected to the bump metal film and whose connection terminal is exposed on a back surface side of the semiconductor substrate; and forming a metal bump by etching the seed metal film while using the bump metal film as a mask.

In one preferred mode of the present invention, first the bump metal film (an Au film, a Cu film, or the like) that is shaped like a ring, or the like to have the opening portion in its center portion is patterned on areas of the seed metal film corresponding to the connecting pads of the semiconductor substrate.

In this step, for example, the masking layer having the ring-like opening portions on the areas of the seed metal film corresponding to the connecting pads is formed, and then the ring-like bump metal films are formed in the opening portions of the masking layer by the electroplating utilizing the seed metal film as the plating power-supply layer or the electroless plating. Then, the island-like portions of the masking layer on the opening portions of the bump metal films are removed selectively by the laser, or the like, and thus the opening portions of the bump metal films are exposed. The portions in which the through hole is formed respectively are defined by the opening portions of the bump metal films.

Then, the through holes that pass through the semiconductor substrate are formed by etching sequentially the seed metal film, the connecting pads, and the semiconductor substrate located under the opening portions while using the bump metal films as a mask. Then, the back surface of the semiconductor substrate is ground to reduce a thickness to about 150 $\mu$m or less. In this step, the through holes may be formed by forming the holes each having a predetermined depth that does not pass through the semiconductor substrate, and then grinding the back surface of the semiconductor substrate to expose the holes.

Then, the insulating film for covering the side surfaces of the through holes in the semiconductor substrate is formed selectively. In turn, the through hole is formed in the opening portions of the bump metal films and the through holes by the electroplating utilizing the seed metal film and the bump metal films connected to the seed metal film as the plating power-supply layer. Then, the metal bumps are obtained by etching the seed metal film while using the bump metal films as a mask.

In this manner, the metal bumps on the element forming surface side of the semiconductor substrate are connected electrically to the connection terminals of the through wirings on the back surface side via the through holes.

As described above, in the method of manufacturing the semiconductor device of the present invention, the bump metal films each having a ring-like shape, or the like having the opening portion in its center portion are formed in the areas corresponding to the connecting pads in registration with them, and then the through holes are formed by etching the seed metal film, the connecting pads, and the semiconductor substrate located under the opening portions.

In other words, the portions on which the bump metal film is formed and the portions in which the through hole being communicated with the opening portion is formed can be defined simultaneously over the connecting pads by executing one time the masking step. Therefore, in order to form the through holes, there is no need to execute particularly the masking step and therefore the number of masking steps can be reduced in contrast to the prior art. In addition to this, since only displacement between the connecting pads and the bump metal films should be taken into consideration, an alignment precision among the connecting pads, the bump metal films, and the through holes can be improved. As a result, the metal bumps and the through holes that correspond to the connecting pads as the finer patterns can be formed easily.

In addition, upon grinding the back surface of the semiconductor substrate, the semiconductor substrate and the through wirings are not ground simultaneously, but merely the semiconductor substrate is ground. Therefore, the semiconductor substrate can be ground by the normal grinding equipment not to generate any trouble. As a result, unlike the prior art, because there is no need to introduce the special grinding equipment, an increase in a production cost is never brought about.

DETAILED DESCRIPTION OF THE PREFERRED EMBODIMENTS

Embodiments of the present invention will be explained with reference to the accompanying drawings hereinafter.

First Embodiment

FIG. 2A to FIG. 2M are sectional views showing a method of manufacturing a semiconductor device according to a first embodiment of the present invention in order of the step, and FIG. 3A to FIG. 3D are sectional views showing an example of a method of packaging the semiconductor device according to the first embodiment of the present invention.

Figure 1A:
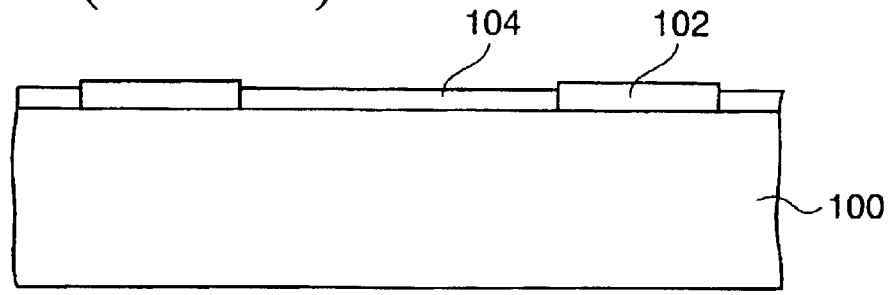
FIG. 1A to FIG. 1G are sectional views showing an example of a method of forming through wirings in a semiconductor chip in the related art.
Figure 1B:
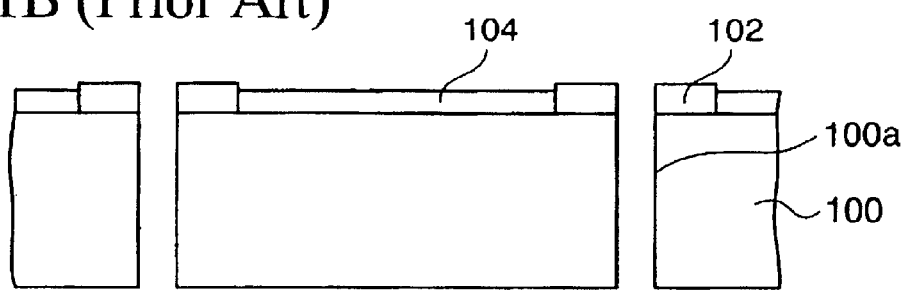
Figure 1C:
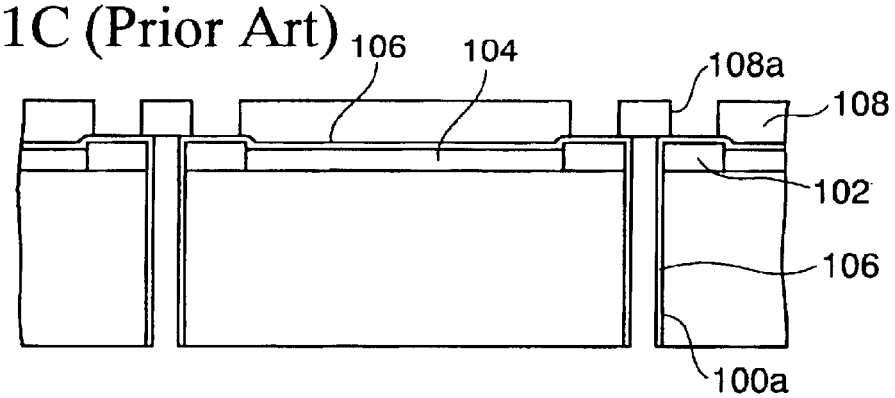
Figure 1D:
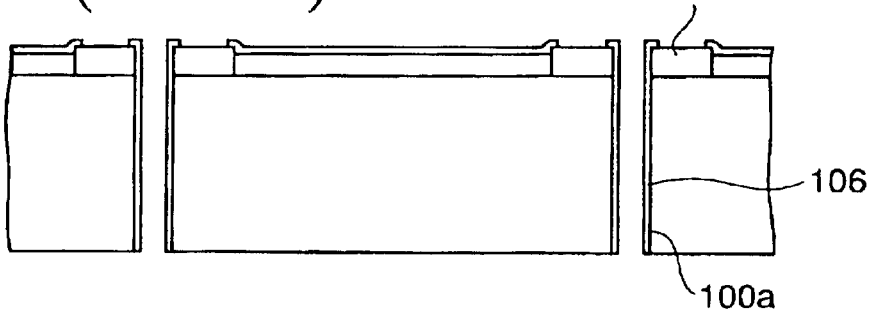
Figure 1E:
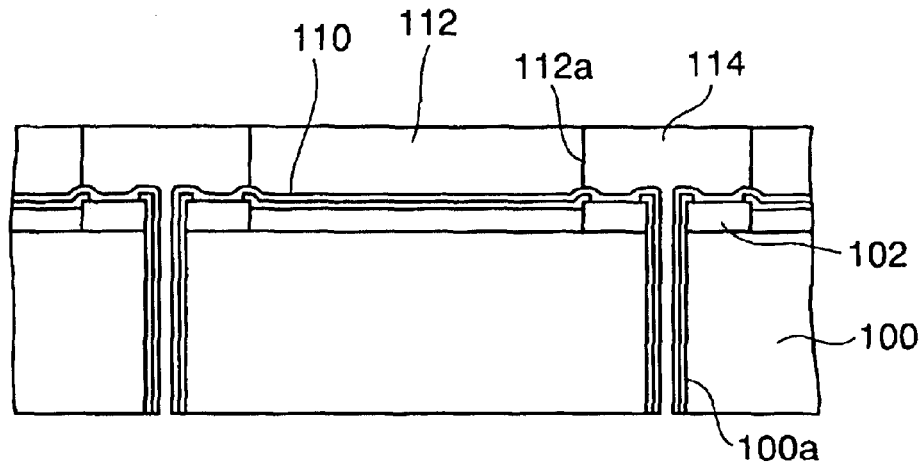
Figure 1F:
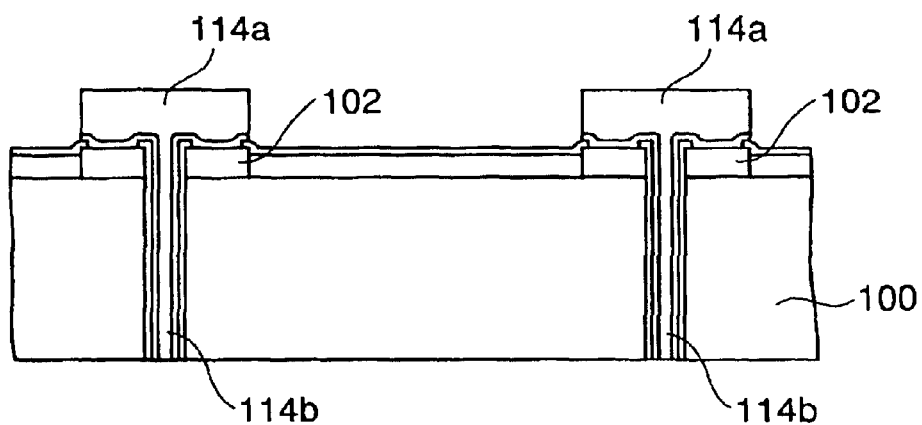
Figure 1G:
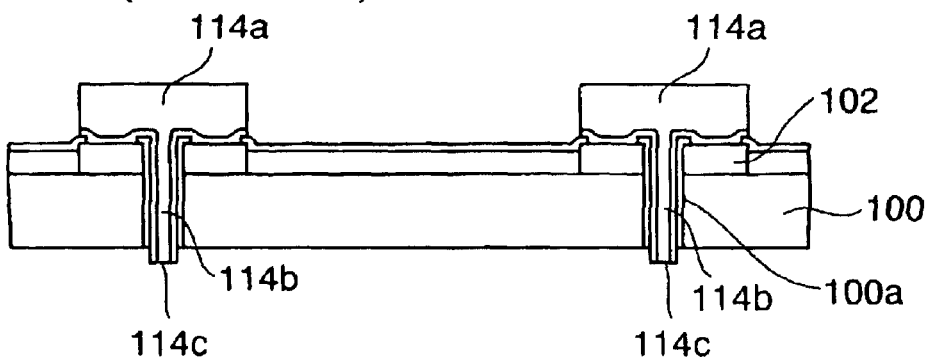
Figure 2A:
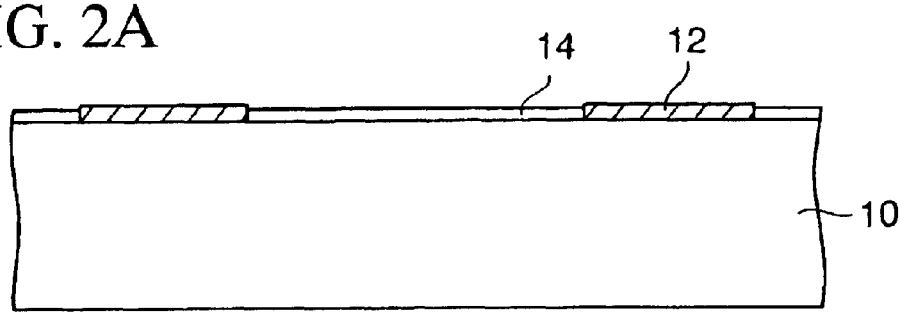
FIG. 2A to FIG. 2M are sectional views showing a method of manufacturing a semiconductor device according to a first embodiment of the present invention, wherein a plan view (lower view) of FIG. 2B is depicted by viewing a portion in a sectional view (upper view) from the top side.

In the method of manufacturing the semiconductor device according to the first embodiment of the present invention, as shown in FIG. 2A, first a semiconductor wafer (semiconductor substrate) 10 on which predetermined elements, multi-layered wirings (not shown), etc. are formed and which has a thickness of about 400 μm is prepared. Connecting pads 12 made of Al, Al alloy, Cu, or the like are formed on the element forming surface of the semiconductor wafer 10 to be exposed from the element forming surface. Portions except the connecting pads 12 are covered with a passivation film 14 made of a silicon nitride film, a polyimide resin, or the like.

Figure 2B:
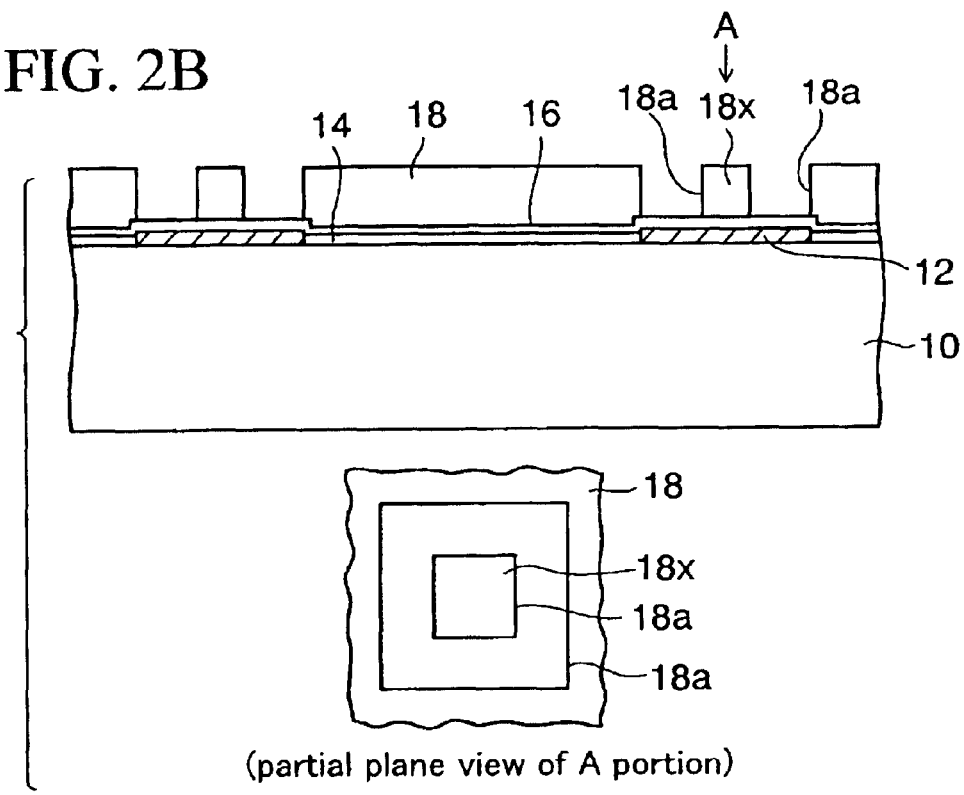

Then, as shown in FIG. 2B, a seed metal film 16 having a film thickness of about 0.5 μm, for example, is formed on the connecting pads 12 and the passivation film 14 by the electroless plating, or the sputter method. As the seed metal film 16, a metal film selected from a gold (Au) film, a copper (Cu) film, a nickel (Ni) film, a chromium (Cr) film, a titanium (Ti) film, a tungsten (W) film, etc. or their laminated film is used.

Then, a dry-film resist film 18, which has island-like patterns 18x in predetermined center portions of the connecting pads 12 and opening portions 18a in peripheral portions except the island-like patterns 18x, is formed on the seed metal film 16 by the photolithography (see a plan view of FIG. 2B). In this case, since the island-like patterns 18x of the dry-film resist film 18 correspond to portions in which through holes passing through the connecting pads 12, etc. are formed later, such areas are not particularly restricted as far as such areas are located within areas corresponding to the connecting pads 12. The island-like patterns 18x may be formed at positions which are deviated toward the peripheral side of the connecting pads 12.

Figure 2C:
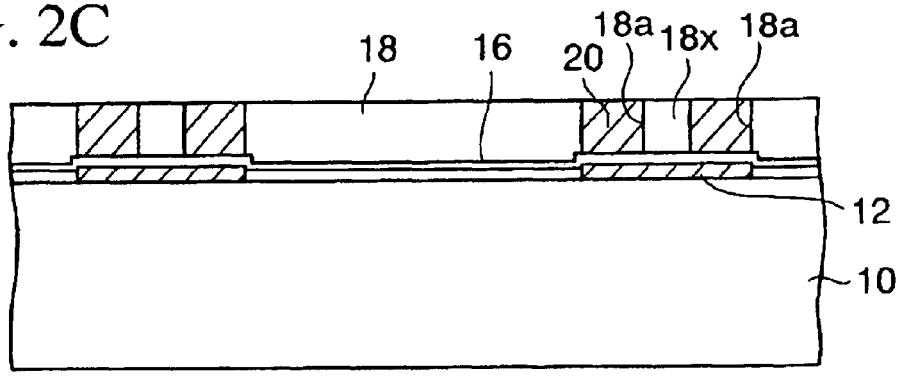

Then, as shown in FIG. 2C, a bump metal film 20 of about 10 to 200 μm thickness is formed in the opening portions 18a in the dry-film resist film 18 by the electroplating utilizing the seed metal film 16 as a plating power-supply layer. At this time, the bump metal film 20 is formed like a ring in the opening portions 18a of the dry-film resist film 18 except the island-like patterns 18x over the connecting pads 12.

As the bump metal film 20, for example, an Au film, a Cu film, a Ni film/Au film laminated sequentially from the bottom, a solder film such as tin (Sn)-lead (Pb) series, etc., a Pb-free solder film such as tin (Sn)-silver (Ag) series, etc. may be employed. The bump metal film 20 formed in the opening portions 18a of the dry-film resist film 18 acts later as the bumps of the semiconductor chip.

In this case, in place of formation of the bump metal film 20 by the electroplating, the bump metal film 20 such as an Au film, a Cu film, or the like may be formed by the electroless plating.

Figure 2D:
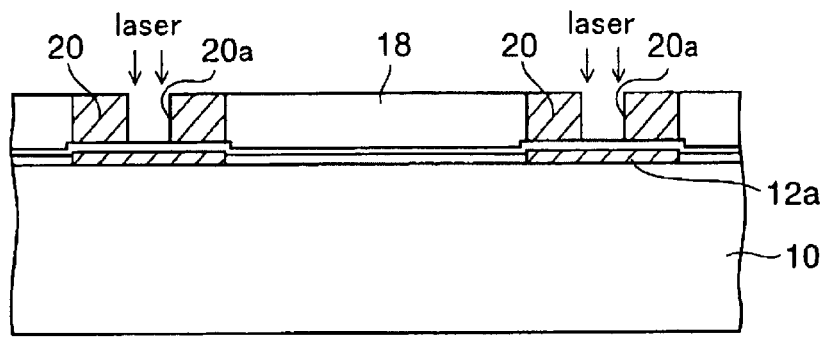

Then, as shown in FIG. 2D, the island-like patterns 18x of the dry-film resist film 18 are etched selectively by the laser while using the bump metal films 20 as a mask. Thus, opening portions 20a of the bump metal films 20 are exposed, and thus portions in which through holes are formed are defined in the semiconductor wafer 10.

Figure 2E:
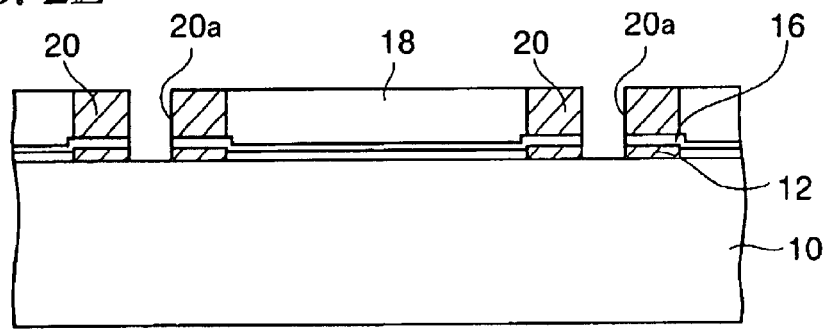

Then, as shown in FIG. 2E, while using the bump metal films 20 and the dry-film resist film 18 as a mask, the seed metal film 16 exposed from the opening portions 20a of the bump metal films 20 is etched by RIE (Reactive Ion Etching), and then the underlying connecting pads 12 are etched. For example, the RIE using a fluorine-based gas ($CF_4$, etc.) is employed when the Au film is used as the seed metal film 16, while the RIE using a chlorine-based gas ($Cl_2$, etc.) is employed when the Al film is used as the connecting pads 12. In this case, it is preferable that a combination of materials having a high selective etching ratio in the RIE should be employed as the bump metal films 20 serving as a mask and the to-be-etched seed metal film 16. However, since a film thickness of the bump metal films 20 is considerably larger than that of the seed metal film 16, no trouble occurs even if both films are made of the same material such as the Au film, or the like.

Figure 2F:
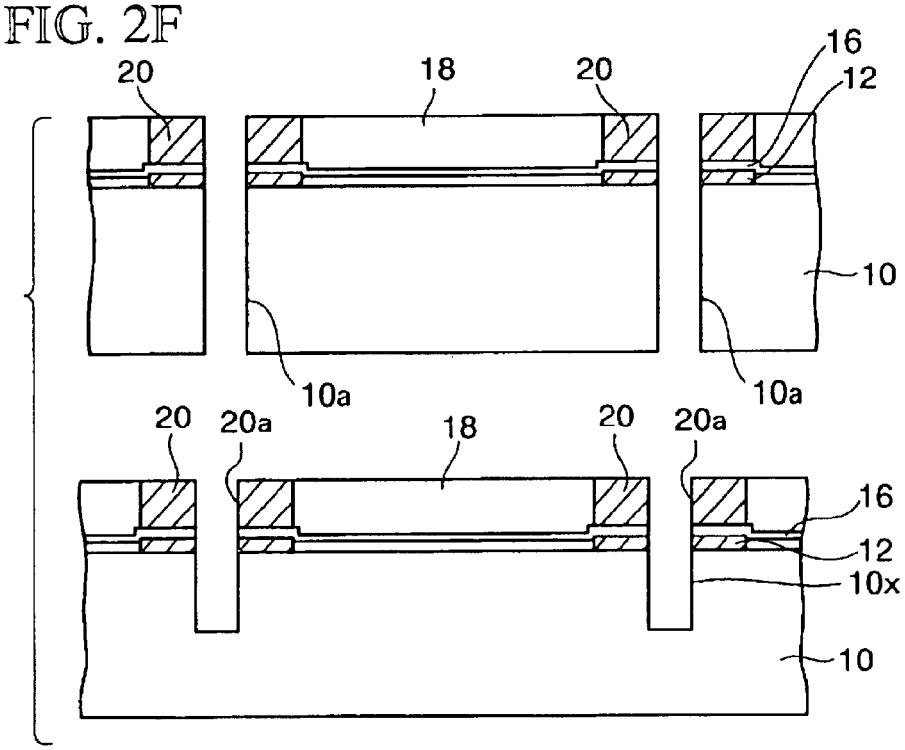

Then, as shown in FIG. 2F (upper view), the semiconductor wafer (silicon wafer) 10 is etched by the RIE using the fluorine-based gas ($CF_4$, etc.) while using the bump metal films 20 and the dry-film resist film 18 as a mask. Thus, through holes 10a each having a depth that reaches the back surface are formed.

At this time, since a selective etching ratio (etching rate of the semiconductor wafer 10/etching rate of the bump metal film 20) upon etching the semiconductor wafer (silicon wafer) 10 by the RIE using the fluorine-based gas is considerably high, a film thickness of the bump metal films 20 is in no means largely reduced. Also, similarly the dry-film resist film 18 still remains at a predetermined film thickness. In this case, the through holes 10a may be formed by the etching using the laser instead of the RIE.

In this way, the through holes 10a each passing from an upper surface of the seed metal film 16 to the back surface of the semiconductor wafer 10 and connected to the opening portion 20a of the bump metal film 20 are formed. Sometimes the through holes 10a containing the opening portions 20a of the bump metal films 20 are called the through holes 10a.

As described above, since the dry-film resist film 18 having the ring-like opening portions 18a in the areas that correspond to the connecting pads 12 is formed in alignment with the connecting pads 12, portions on which the bump metal film 20 is formed and portions in which the through hole 100a is formed are defined at the same time on the connecting pads 12 respectively. Then, the seed metal films 16, the connecting pads 12, and the semiconductor wafer 10 located under the island-like patterns 18x of the dry-film resist film 18 (corresponding to the opening portions 20a of the bump metal films 20) are etched, so that the through holes 10a are formed.

In other words, the portions on which the bump metal film 20 is formed and the portions in which the through hole 10a being communicated with the opening portion 20a is formed can be defined simultaneously over the connecting pads 12 by executing one masking step. Therefore, since the number of masking steps can be reduced rather than the prior art and also only the displacement between the connecting pads 12 and the bump metal films 20 should be taken into consideration, an alignment precision between the bump metal films 20 and the through holes 10a can be improved. As a result, the bumps and the through holes that can respond to the connecting pads 12 as the finer patterns can be formed easily.

Figure 2G:
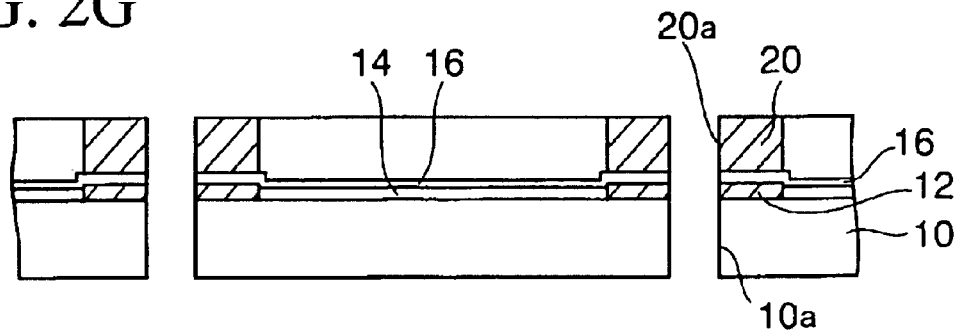

Then, as shown in FIG. 2G, a thickness is reduced to about 150 μm or less (preferably, about 50 μm or less) by grinding the back surface of the semiconductor wafer 10 by means of the grinder. At this time, since ground portions of the semiconductor wafer 10 are made of silicon, for example, and the material such as the Cu film that is different from the semiconductor wafer 10 is not present, such ground portions can be ground by the normal grinder not to generate any trouble. Therefore, unlike the prior art, there is no need to introduce the special grinder, and therefore an increase in a production cost is never brought about.

As a variation of the method of forming the through holes 10a, as shown in FIG. 2F (lower view), in the step of forming the through holes 10a, the through holes 10a similar to those in FIG. 2G may be formed by forming holes 10x each having a depth of about 150 μm or less, which does not pass through the semiconductor wafer 10, and then grinding the back surface of the semiconductor wafer 10 to expose the holes 10x. In this case, since the holes 10x each having a depth that corresponds to a finally derived thickness of the thinned semiconductor wafer 10 may be formed, a throughput of the step of etching the semiconductor wafer 10 can be improved.

Figure 2H:
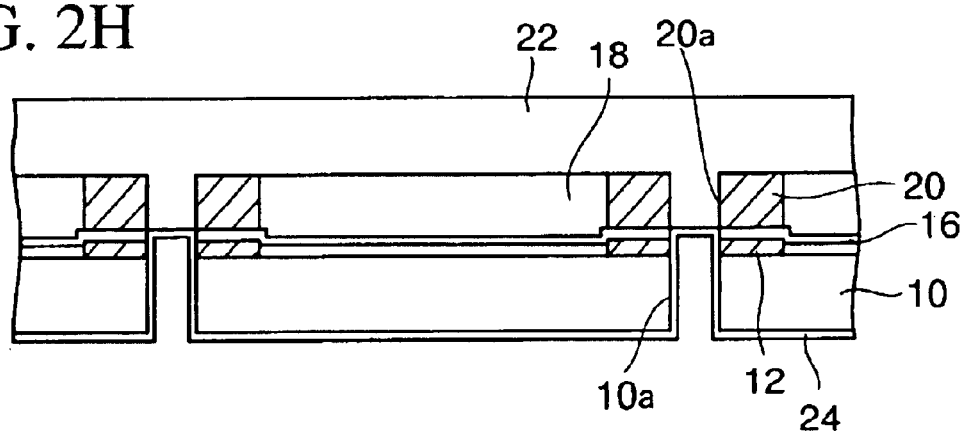

Then, as shown in FIG. 2H, a protection film 22 made of resin, or the like is pasted onto the bump metal films 20 and the dry-film resist film 18 over the thinned semiconductor wafer 10. A this time, the protection film 22 should be buried up to lower portions of the opening portions 20a of the bump metal films 20 or upper portions of the connecting pads 12 in the through holes 10a.

Then, as similarly shown in FIG. 2H, an insulating film 24 made of a silicon oxide film, or the like is formed on inner surfaces of the through holes 10a and the back surface of the semiconductor wafer 10 by the CVD, or the like.

Figure 2I:
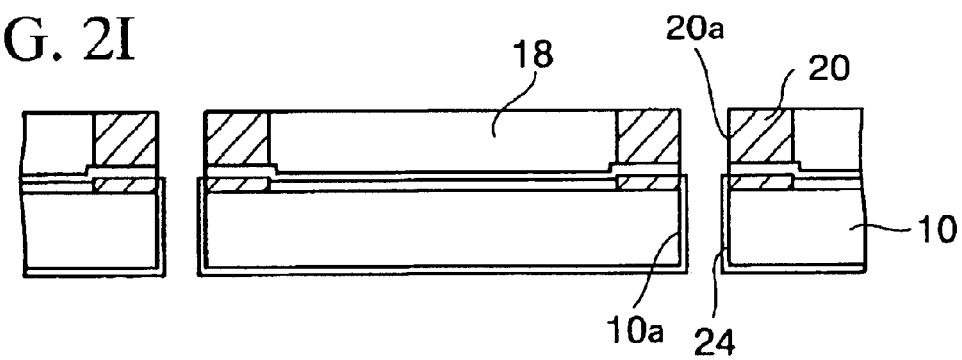

Then, as shown in FIG. 2I, the protection film 22 is released from the bump metal films 20 and the dry-film resist film 18. Thus, the insulating film 24 which is formed on a portion of the protection film 22 buried in the opening portions 20a of the bump metal films 20 is lifted off. As a result, the insulating film 24 is left selectively on side surfaces of the through holes 10a. This insulating film 24 is provided to isolate electrically the through wirings formed in the through holes 10a from the semiconductor wafer 10. In this step, unlike the prior art, the masking step is not used, and therefore the process can be simplified and a production cost can be reduced.

In this case, the step of forming the insulating film 24 on the side surfaces of the through holes 10a may be executed before the back surface of the semiconductor wafer 10 is ground.

Figure 2J:
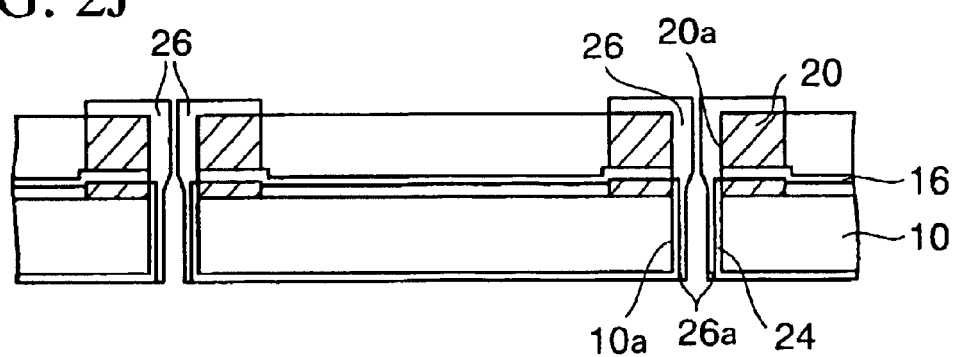

Then, as shown in FIG. 2J, through wirings 26 are formed on inner surfaces of the opening portions 20a of the bump metal films 20 and the inner surfaces of the through holes 10a by the electroplating utilizing the seed metal film 16 and the bump metal films 20 connected thereto as a plating power-supply layer. As the through wirings 26, a metal film made of an Au film, a Cu film, or the like is used.

In this electroplating step, since the seed metal film 16 and the bump metal films 20 are utilized as the plating power-supply layer, the film formation is started from upper surfaces of the seed metal film 16 and the bump metal films 20 exposed from the side surfaces of the through holes 10a and side surfaces of the opening portions 20a, and then the film formation is extended toward lower sides of the through holes 10a. It is preferable that, since the plating is also applied to the upper surfaces of the bump metal films 20, the same material as that of the bump metal films 20 should be used as the material of the through wirings 26.

In the example in FIG. 2J, such a mode is exemplified that a diameter of the through hole 10a is set to almost 20 to 30 μm, a thickness of the semiconductor wafer 10 is set to almost 10 μm, and the through hole 10a is not perfectly buried by the through wiring 26 to form a cavity in its center portion. In this case, portions of the through wirings 26 exposed from inner peripheral portions of the through holes 10a on the back surface side of the semiconductor wafer 10 serve as connection terminals 26a on the back surface side.

Figure 2K:
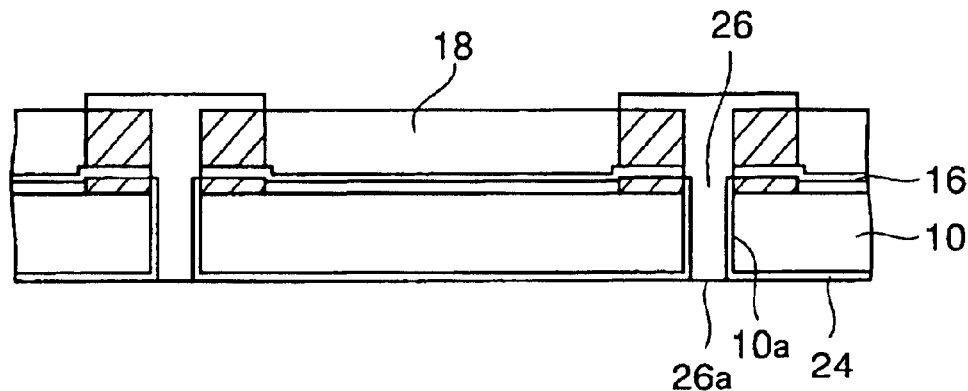

Alternately, as shown in FIG. 2K, the through wiring 26 may be perfectly buried in the through holes 10a by applying the plating continuously. In this case, top end surfaces of the through wirings 26 exposed from bottom portions of the through holes 10a on the back surface side of the semiconductor wafer 10 serve as the connection terminals 26a on the back surface side.

In this fashion, in the present embodiment, a mode (FIG. 2J) in which the cavity may be formed in its center portion over the entire through hole 10a may be employed, or a mode (FIG. 2K) in which the through hole 10a is buried perfectly by the through wiring 26 may be employed. Otherwise, a mode in which the opening portion 20a of the bump metal films 20 is buried by the through wiring 26 but the cavity is formed in its center portion of the through hole 10a may be employed.

In case the through hole 10a is buried perfectly by the through wiring 26, it is preferable that a diameter of the through hole 10a should be set smaller than a thickness of the semiconductor wafer 10. On the contrary, in case the through hole 10a is not buried by the through wiring 26, it is preferable that the diameter of the through hole 10a should be set larger than the thickness of the semiconductor wafer 10. In this manner, the diameter of the through hole 10a and the thickness of the semiconductor wafer 10 can be adjusted appropriately so as to fit in with the final shape of the through wiring 26.

Figure 2L:
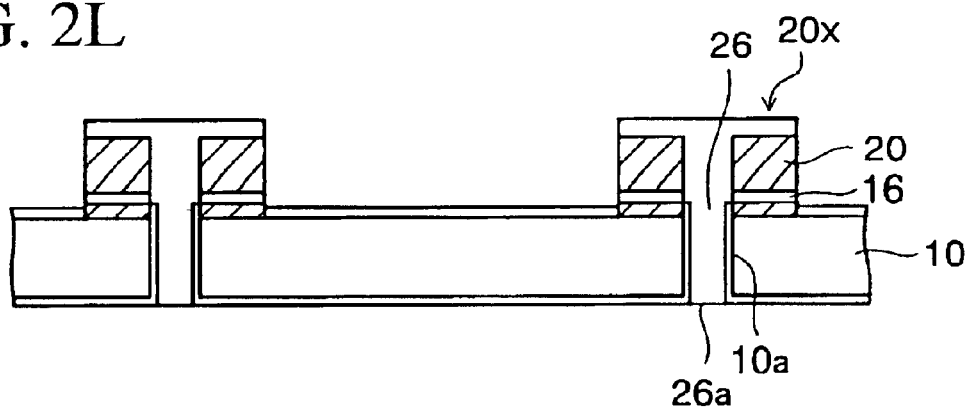

Then, as shown in FIG. 2L, the dry-film resist film 18 is removed and then the seed metal film 16 is etched by using the bump metal films 20 as a mask. Thus, metal bumps 20x each consisting of the bump metal film 20 and an upper portion of the through wiring 26 are obtained.

In this way, the metal bumps 20x on the element forming surface side of the semiconductor wafer 10 are connected electrically to the connection terminals 26a on the back surface side via the through holes 10a.

Figure 2M:
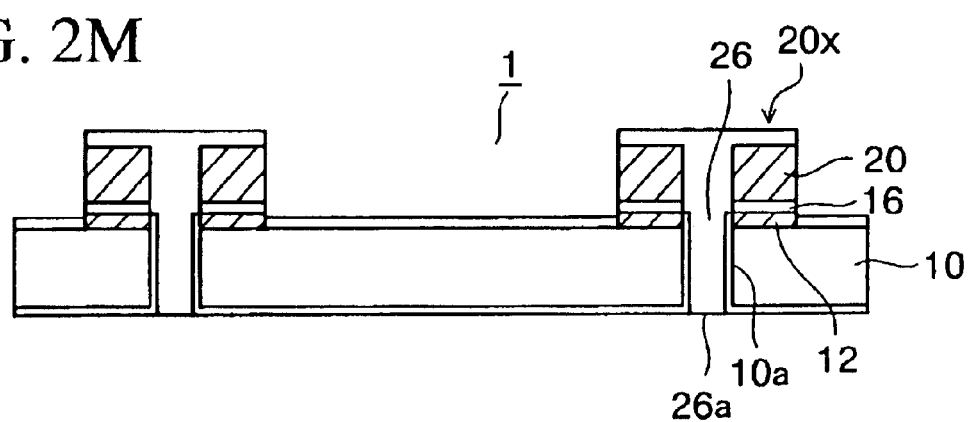

Then, as shown in FIG. 2M, individual semiconductor chips 1 (semiconductor devices) that are divided into individual pieces are obtained by dicing the semiconductor wafer 10.

As described above, in the method of manufacturing the semiconductor device according to the present embodiment, the portions on which the metal bumps 20x are formed and the portions in which the through holes 10a are formed are defined at the same time on the connecting pads 12 respectively by applying one time the masking step onto the connecting pads 12 of the semiconductor wafer 10. Therefore, the number of masking steps can be reduced in contrast to the prior art and also the alignment precision can be improved.

In addition, since only the semiconductor wafer 10 is ground upon grinding the back surface of the semiconductor wafer 10, the semiconductor wafer 10 can be thinned to a predetermined thickness by the normal grinding equipment without generation of any trouble.

Figure 3A:
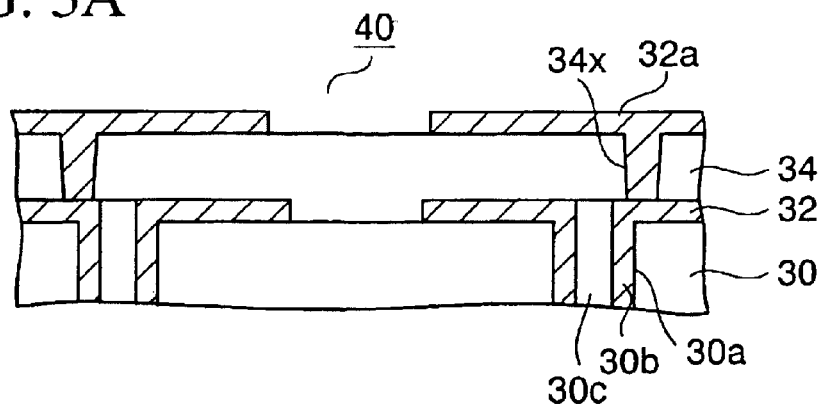
FIG. 3A to FIG. 3D are sectional views showing an example of a method of packaging the semiconductor device according to the first embodiment of the present invention.

Next, an example of the packaging structure into which the semiconductor chip 1 according to the present embodiment is packaged will be explained hereunder. In this case, in the present embodiment, the chip in which the through wiring 26 is buried completely in the through holes 10a respectively is used as the semiconductor chip 1. First, as shown in FIG. 3A, a wiring substrate 40 on which the semiconductor chip 1 is mounted is prepared. In this wiring substrate 40, through holes 30a are provided in a base substrate 30 made of resin, or the like. Then, a through-hole plating layer 30b connected to a first wiring pattern 32 on the base substrate 30 is formed on inner surfaces of the through holes 30a respectively. The through holes are buried by a resin body 30c respectively.

Also, a first interlayer insulating film 34 made of resin such as polyimide, epoxy, or the like and having via holes 34x therein is formed on the first wiring patterns 32. In addition, second wiring patterns 32a connected to the first wiring patterns 32 via the via holes 34x are formed on the first interlayer insulating film 34.

Figure 3B:
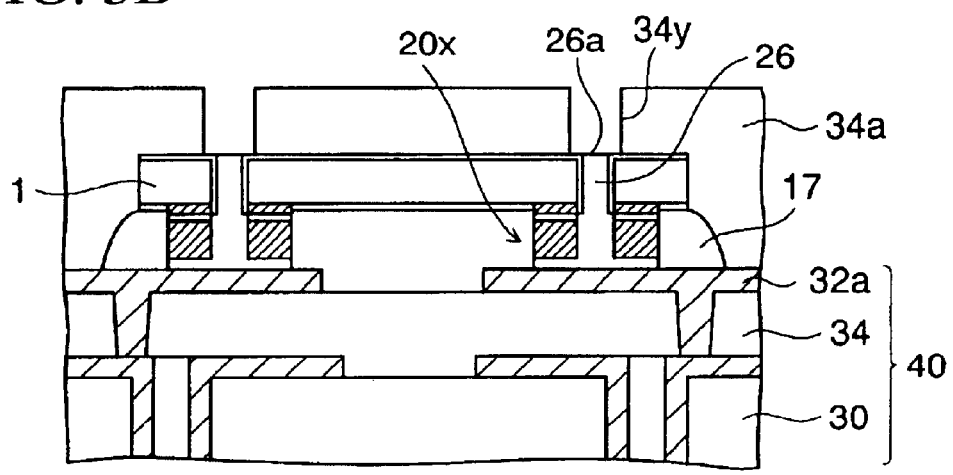

Then, as shown in FIG. 3B, the above metal bumps 20x of the semiconductor chip 1 are flip-chip bonded to the second wiring patterns 32a of the wiring substrate 40. Then, an underfill resin 17 is filled into clearances between the semiconductor chip 1 and, the second wiring patterns 32a and the first interlayer insulating film 34.

Then, a second interlayer insulating film 34a made of resin to cover the semiconductor chip 1 is formed. Then, via holes 34y each reaching an upper surface of the connection terminal 26a of the through wiring 26 are formed by etching predetermined portions of the second interlayer insulating film 34a on the connection terminals 26a of the through wirings 26 by means of the laser, or the like.

Figure 3C:
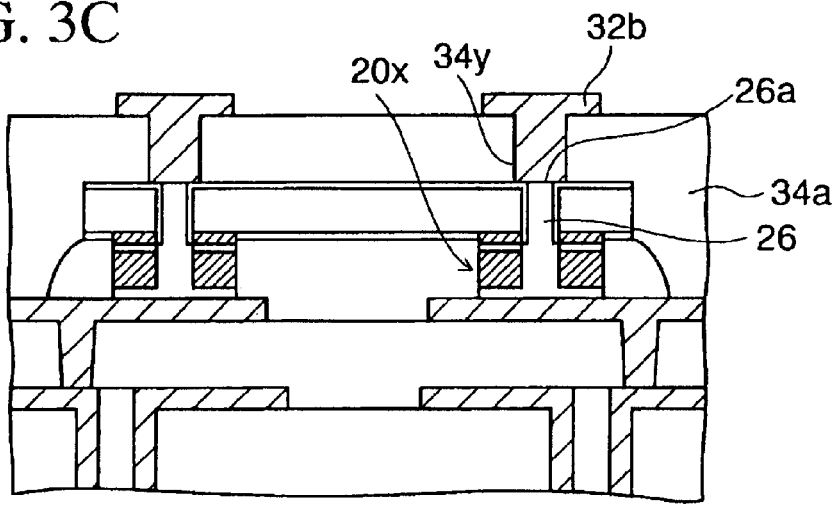

Then, as shown in FIG. 3C, third wiring patterns 32b connected to the connection terminal 26a of the through wiring 26 via the via holes 34y are formed by the ordinary wiring forming method such as the semi-additive process, or the like.

In this case, respective steps from the step of flip-chip bonding the above metal bumps 20x of the semiconductor chip 1 to the second wiring patterns 32a to the step of forming the third wiring patterns 32b may be repeated predetermined times subsequently. In this case, a plurality of semiconductor chips 1 are buried in the interlayer insulating film respectively and packaged three-dimensionally, and also a plurality of semiconductor chips 1 are connected mutually via the through holes 10a in the semiconductor chip 1 and the via holes formed in the interlayer insulating film.

Figure 3D:
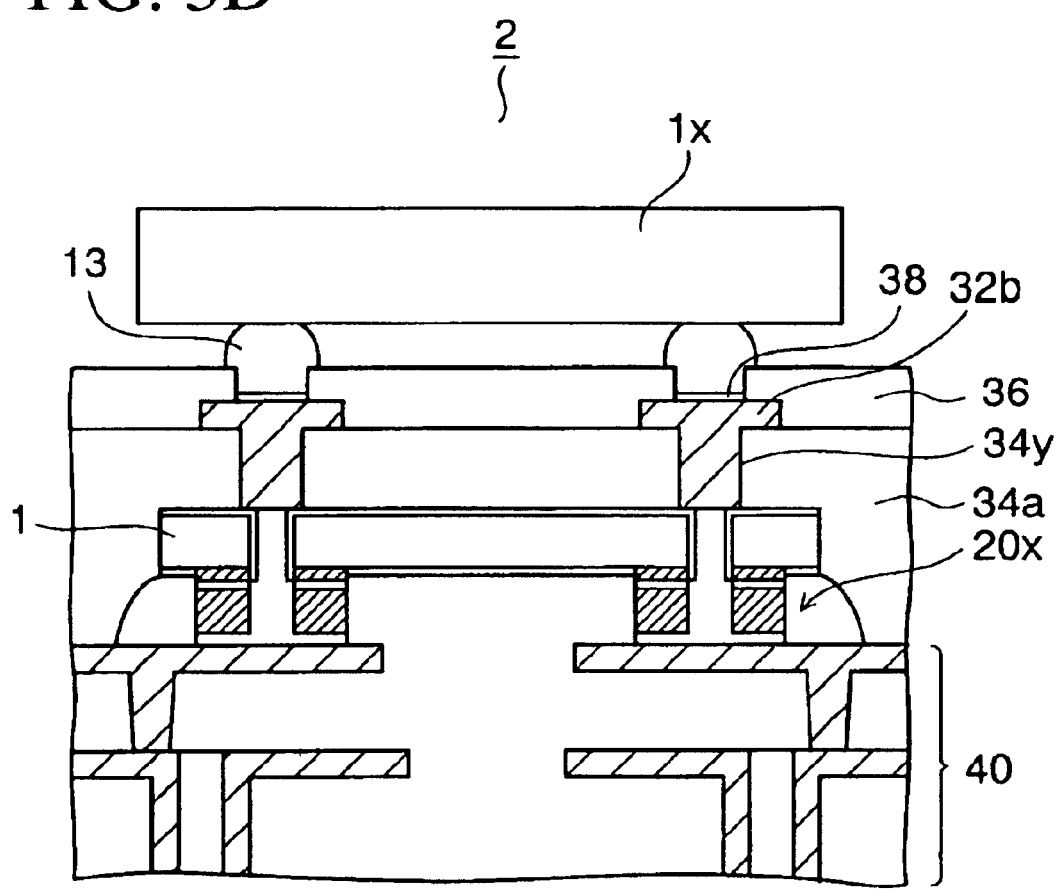

Then, as shown in FIG. 3D, a solder resist film 36 having opening portions on the connection portions of the third wiring patterns 32b is formed, and then an Ni/Au film 38 is formed on the connection portions of the third wiring patterns 32b by the electroless plating.

Then, bumps 13 of an overlying semiconductor chip 1x having the bumps 13 are flip-chip bonded to the Ni/Au films 38 on the third wiring patterns 32b. With the above, a packaging structure 2 into which the semiconductor chip 1 of the present embodiment is packaged is obtained.

In this case, in addition to the above packaging structure, various packaging structures such as a structure in which the semiconductor chip 1 is not buried in the interlayer insulating film and metal bumps of another semiconductor chip are bonded directly to the connection terminals 26a on the back surface of the semiconductor chip 1, etc. may be employed.

Also, any of various shapes described above may be employed as the shape of the metal bumps 20x of the semiconductor chip 1. For example, in case the metal bumps 20x of the semiconductor chip 1 are made of the Au film and the metal bumps have the cavity in their center portion (the shape in FIG. 2J), when the metal bumps 20x of the semiconductor chip 1 are bonded to Au electrodes of a wiring substrate etc. by Au—Au bonding with the ultrasonic wave, the metal bumps 20x can be bonded simultaneously at their outer peripheries and their inner peripheries. Therefore, the mode has an advantage that the metal bumps 20x are easily bonded.

Second Embodiment

FIG. 4A to FIG. 4F are sectional views showing a method of manufacturing a semiconductor device according to a second embodiment of the present invention. A difference of the second embodiment from the first embodiment resides in that holes not passing through the semiconductor wafer 10 are formed in advance upon forming the through holes 10a in the semiconductor wafer 10, then the through wiring is buried in the holes respectively, and then the connection terminals of the through wirings are exposed by grinding the back surface of the semiconductor wafer 10.

In the second embodiment, detailed explanation of the same steps as those in the first embodiment will be omitted herein. Also, the same symbols are affixed to the same elements as the first embodiment, and their explanation will be omitted herein.

Figure 4A:
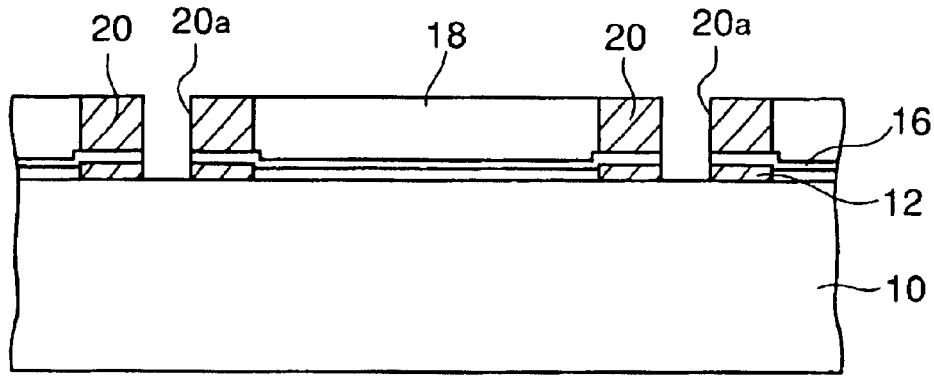
FIG. 4A to FIG. 4F are sectional views showing a method of manufacturing a semiconductor device according to a second embodiment of the present invention.
Figure 4B:
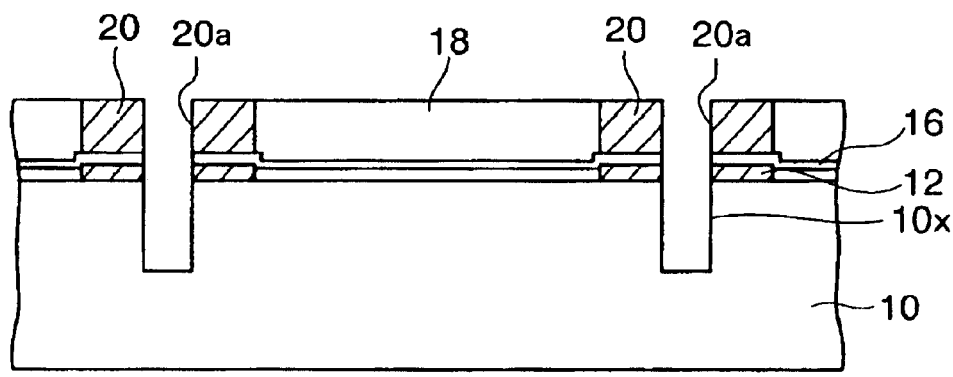

In the method of manufacturing the semiconductor device according to the second embodiment, as shown in FIG. 4A, the semiconductor wafer having the same structure as shown in FIG. 2E is prepared by the similar method to the first embodiment. Then, as shown in FIG. 4B, the semiconductor wafer 10 is etched in the middle of its thickness by using the bump metal films 20 and the dry-film resist film 18 as a mask. Thus, the holes 10x having a depth of about 150 μm or less (preferably about 50 μm or less) are formed.

Figure 4C:
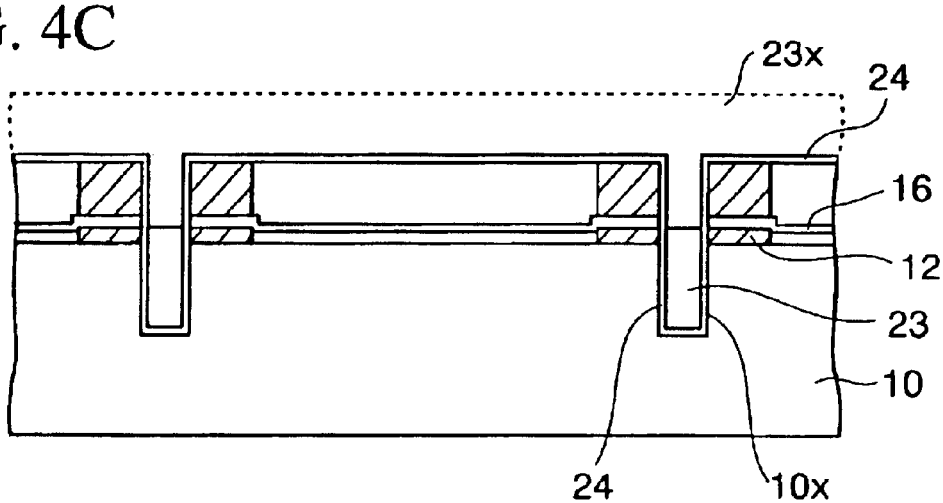

Then, as shown in FIG. 4C, the insulating film 24 for covering the opening portions 20a of the bump metal films 20 and the holes 10x and made of the silicon oxide film, etc. is formed on the resultant structure in FIG. 4B by the CVD, or the like. Then, a resist coating film 23x is formed to fill the opening portions 20a of the bump metal films 20 and the holes 10x by coating a positive resist coating liquid on the insulating film 24.

Then, an overall surface of the resist coating film 23x is exposed under predetermined exposure conditions and then developed. At this time, since predetermined portions of the resist coating film 23x filled in the holes 10x are not exposed, the resist film 23 is left selectively on lower portions of the holes 10x containing the connection pads 12.

Then, the insulating film 24 is etched by the isotropic dry etching or the wet etching while using the resist films 23 as a mask, and then the resist film 23 is removed.

Figure 4D:
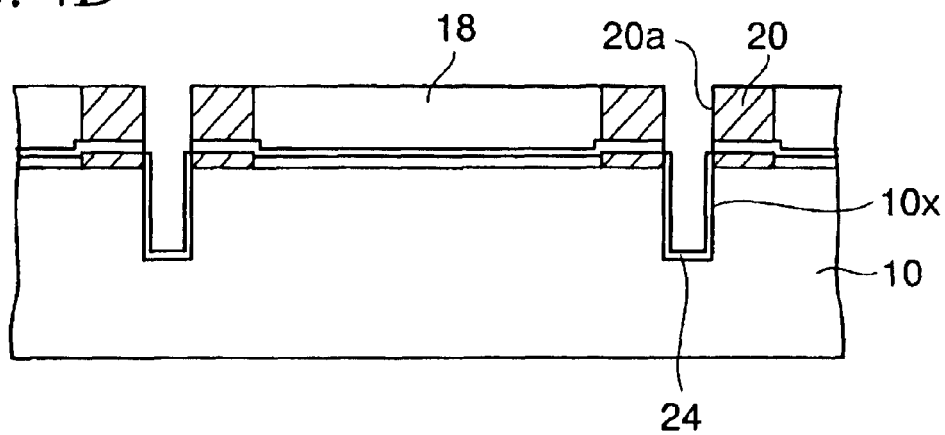

Then, as shown in FIG. 4D, the insulating film 24 is left selectively in the holes 10x of the semiconductor wafer 10. Like the first embodiment, this insulating film 24 is provided to isolate electrically the through wirings formed in the holes 10x from the semiconductor wafer 10.

Figure 4E:
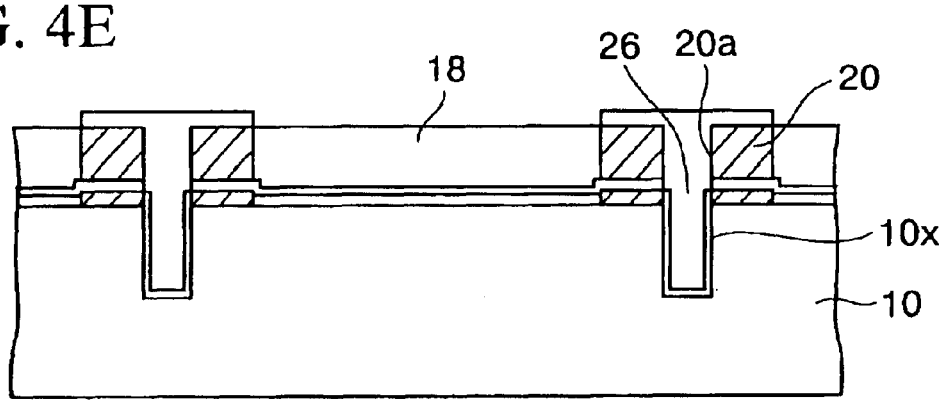

Then, as shown in FIG. 4E, the through wiring 26 is formed in the opening portions 20a of the bump metal films 20 and the holes 10x by the electroplating in the similar way to the first embodiment. In this case, the through wiring 26 may be formed into various shapes explained in the first embodiment.

Figure 4F:
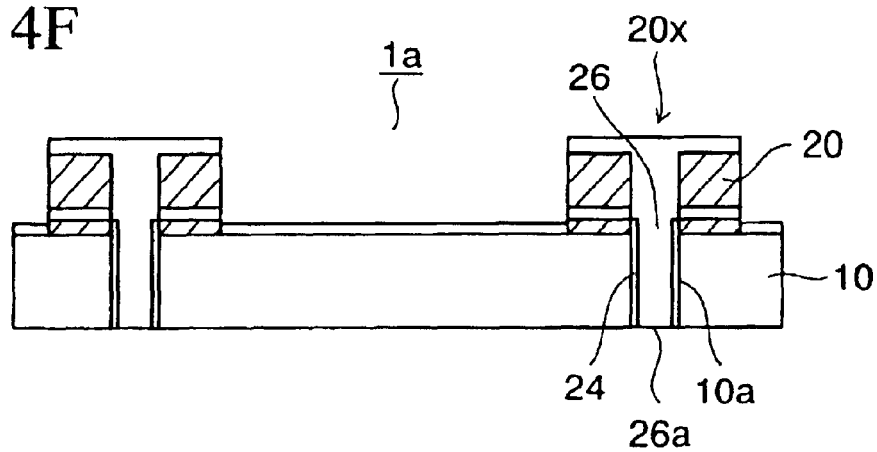

Then, as shown in FIG. 4F, lower top-end surfaces of the through wirings 26 are exposed by grinding the back surface of the semiconductor wafer 10 to provide the connection terminals 26a on the back surface. In this manner, the holes 10x formed in the semiconductor wafer 10 act as the through holes 10a that connect the element forming surface side and the back surface side of the semiconductor wafer 10.

Then, according to the similar method to the first embodiment, the dry-film resist film 18 is removed, and then the metal bumps 20x are obtained by etching the seed metal film 16 while using the bump metal films 20 as a mask. The metal bumps 20x connected to the connecting pads 12 are connected electrically to the connection terminals 26a on the back surface side via the through holes 10a. In this case, the removal of the dry-film resist film 18 and the etching of the seed metal film 16 may be carried out before the back surface of the semiconductor wafer 10 is ground. Then, individual semiconductor chips 1a (semiconductor devices) that are divided into individual pieces are obtained by dicing the semiconductor wafer 10.

According to the method of manufacturing the semiconductor device according to the second embodiment, similar advantages to the first embodiment can be achieved.

What is claimed is:

1. A semiconductor device manufacturing method comprising the steps of:
    preparing a semiconductor substrate having a connecting pad on an element forming surface;
    forming a seed metal film to cover the connecting pad on the semiconductor substrate;
    forming a bump metal film as a pattern having an opening portion in a predetermined portion on an area of the seed metal film that corresponds to the connecting pad;
    forming a through hole, which is communicated with the opening portion of the bump metal film and passes through to a back surface of the semiconductor substrate, by etching sequentially the seed metal film, the connecting pad, and the semiconductor substrate located under the opening portion of the bump metal film, while using the bump metal film as a mask;
    reducing a thickness of the semiconductor substrate by grinding the back surface of the semiconductor substrate;
    forming selectively an insulating film to cover at least the semiconductor substrate on a side surface of the through hole before or after the step of reducing a thickness of the semiconductor substrate;
    forming a conductive film in the opening portion of the bump metal film and the through hole by an electroplating, which utilizes the seed metal film and the bump metal film connected to the seed metal film as a plating power-supply layer, to provide a through wiring which is connected to the bump metal film and whose connection terminal is exposed on a back surface side of the semiconductor substrate; and
    forming a metal bump by etching the seed metal film while using the bump metal film as a mask.

2. A semiconductor device manufacturing method comprising the steps of:
    preparing a semiconductor substrate having a connecting pad on an element forming surface;
    forming a seed metal film to cover the connecting pad on the semiconductor substrate;
    forming a bump metal film as a pattern having an opening portion in a predetermined portion on an area of the seed metal film that corresponds to the connecting pad;
    forming a hole, which is communicated with the opening portion of the bump metal film and does not pass through the semiconductor substrate, by etching the seed metal film and the connecting pad located under the opening portion of the bump metal film and then etching the semiconductor substrate to a middle of a thickness, while using the bump metal film as a mask;
    grinding the back surface of the semiconductor substrate to reduce a thickness of the semiconductor substrate and also expose the hole to obtain a through hole;
    forming selectively an insulating film to cover at least the semiconductor substrate on a side surface of the through hole;
    forming a conductive film in the opening portion of the bump metal film and the through hole by an electroplating, which utilizes the seed metal film and the bump metal film connected to the seed metal film as a plating power-supply layer, to provide a through wiring which is connected to the bump metal film and whose connection terminal is exposed on a back surface side of the semiconductor substrate; and
    forming a metal bump by etching the seed metal film while using the bump metal film as a mask.

3. A semiconductor device manufacturing method comprising the steps of:
    preparing a semiconductor substrate having a connecting pad on an element forming surface;
    forming a seed metal film to cover the connecting pad on the semiconductor substrate;
    forming a bump metal film as a pattern having an opening portion in a predetermined portion on an area of the seed metal film that corresponds to the connecting pad;
    forming a hole, which is communicated with the opening portion of the bump metal film and does not pass through the semiconductor substrate, by etching the seed metal film and the connecting pad located under the opening portion of the bump metal film and then etching the semiconductor substrate to a middle of a thickness while using the bump metal film as a mask;
    forming selectively an insulating film to cover at least the semiconductor substrate on a side surface of the hole;
    forming a conductive film in the opening portion of the bump metal film and the hole by an electroplating, which utilizes the seed metal film and the bump metal film connected to the seed metal film as a plating power-supply layer;
    providing a through wiring, which is connected to the bump metal film and whose connection terminal is exposed on a back surface side of the semiconductor substrate, by grinding the back surface of the semiconductor substrate until the conductive film formed in the hole is exposed; and
    forming a metal bump by etching the seed metal film while using the bump metal film as a mask.

4. A semiconductor device manufacturing method according to any one of claims 1 to 3, wherein the step of forming a bump metal film as a pattern, includes the steps of,
    forming a masking layer having an opening portion and an island-like pattern, which is arranged in a predetermined portion on the opening portion, on an area of the seed metal film corresponding to the connecting pad,
    forming the bump metal film in the opening portion of the masking layer by an electroplating utilizing the seed metal film as the plating power-supply layer, or an electroless plating,
    exposing the opening portion of the bump metal film by removing selectively the island-like pattern of the masking layer, and further comprising the step of:
removing the masking layer prior to the step of forming the metal bump.

5. A semiconductor device manufacturing method according to claim 1 or 2, wherein the step of forming selectively the insulating film, includes the steps of,
pasting a protection film, which fills at least the opening portion of the bump metal film, on the element forming surface of the semiconductor substrate,
forming an insulating film on a side surface of the through hole and a lower surface of the protection film that is filled in the opening portion of the bump metal film, and
releasing the protection film from the semiconductor substrate to lift off the insulating film formed on the lower surface of the protection film and thus leave selectively the insulating film on a side surface of the through hole in the semiconductor substrate.

6. A semiconductor device manufacturing method according to claim 3, wherein the step of forming selectively the insulating film, includes the steps of,
forming the insulating film to cover the opening portion of the bump metal film and the hole,
forming a masking layer that fills at least the hole but exposes the opening portion of the bump metal film,
etching the insulating film while using the masking layer as a mask so as to leave selectively the insulating film on a side surface of the hole in the semiconductor substrate, and
removing the masking layer.

7. A semiconductor device manufacturing method according to any one of claims 1 to 3, wherein the bump metal film is formed of any one selected from a group of consisting of a gold film, a copper film, a solder film, and a laminated film composed of a nickel film/a gold film.

8. A semiconductor device manufacturing method according to any one of claims 1 to 3, wherein, in the step of grinding the semiconductor substrate, a thickness of the semiconductor substrate is set to about 150 $\mu$m or less.

9. A semiconductor device manufacturing method according to claim 2 or 3, wherein, in the step of forming the hole, the semiconductor substrate is etched such that a depth of the hole is set to about 150 $\mu$m or less.

10. A semiconductor device manufacturing method according to any one of claims 1 to 3, wherein the through wiring is formed to fill the opening portion of the bump metal film and the through hole.

11. A semiconductor device manufacturing method according to any one of claims 1 to 3, wherein the through wiring is formed in a state that a cavity is provided in center portions of the opening portion of the bump metal film and the through hole.

* * * * *